United States Patent [19]
Lee et al.

[11] Patent Number: 5,808,517
[45] Date of Patent: *Sep. 15, 1998

[54] PTM SIGNAL GENERATOR COMBINING OUTPUTS OF MULTIPLE OSCILLATORS

[75] Inventors: Charles A. Lee; G. Conrad Dalman, both of Ithaca, N.Y.

[73] Assignee: Cornell Research Foundation, Inc., Ithaca, N.Y.

[ * ] Notice: The term of this patent shall not extend beyond the expiration date of Pat. No. 5,652,548.

[21] Appl. No.: 762,852
[22] Filed: Dec. 10, 1996
[51] Int. Cl.$^6$ .................................................. H03B 28/00
[52] U.S. Cl. ................................ 331/55; 331/56; 331/96; 331/107 P
[58] Field of Search ................................. 331/55, 56, 96, 331/106, 107 P

[56] References Cited

U.S. PATENT DOCUMENTS

| | | | |
|---|---|---|---|
| 2,803,750 | 8/1957 | Dayem | 331/55 |
| 3,354,408 | 11/1967 | Crowell | 331/107 R |
| 3,475,699 | 10/1969 | Fjallbrant | 332/163 |
| 3,614,659 | 10/1971 | Rigrod | 372/97 |
| 4,048,583 | 9/1977 | Nigrin | 331/56 |
| 4,366,454 | 12/1982 | Salzberg | 333/164 |
| 4,467,284 | 8/1984 | Farkas | 327/181 |
| 4,763,085 | 8/1988 | Lamberg | 331/56 |
| 5,105,168 | 4/1992 | DaSilva | 331/2 |
| 5,172,382 | 12/1992 | Loh et al. | 372/26 |
| 5,212,463 | 5/1993 | Babbitt et al. | 333/161 |
| 5,652,548 | 7/1997 | Lee et al. | 331/55 |

OTHER PUBLICATIONS

Chang, Kai et al., "Millimeter–Wave Power–Combining Techniques", IEEE Transactions on Microwave Theory and Techniques, vol. MTT–31, No. 2, Feb. 1983, pp. 91–107.

Nogi Shigeji et al., "Mode Analysis and Stabilization of a Spacial Power Combining Array with Stronly Coupled Oscillators", IEEE Transactions on Microwave Theory and Techniques, vol. 41, No. 10, Oct. 1993, p. 1827–1837.

York, Robert A. et al., "Quasi–Optical Power Combining Using Mutually Synchronized Oscillator Arrays", IEEE Transactions on Microwave Theory and Techniques, vol. 39, No. 6, Jun. 1991, pp. 100–1009.

York, Robert A, "Nonlinear Analysis of Phase Relationships in Quasi–Optical Oscillator Arrays", IEEE Transactions on Microwave Theory and Techniques, vol. 41, No. 10, Oct. 1993, pp. 1799–1809.

Primary Examiner—Siegfried H. Grimm
Attorney, Agent, or Firm—Jones, Tullar & Cooper, P.C.

[57] ABSTRACT

A high frequency pulse-time modulation (PTM) signal generator employs four or more high frequency oscillators which are mutually locked uniquely either in a symmetric mode or an antisymmetric mode by means of a plurality of electronic phase shifters. The output signals from the oscillators are cascaded together to form a PTM output through control of the electronic phase shifters which shift the mutual locking of the oscillators back and forth between the symmetric and antisymmetric modes. Magic-tees or other combining elements are employed to combine the oscillator output signals so that an output pulse is generated when the oscillators are locked in the symmetric mode and a zero level output is generated when the oscillators are locked in the antisymmetric mode.

20 Claims, 4 Drawing Sheets

Stationary Points of Four Coupled Oscillator Case

| No. | $\theta$ | $\Delta\phi_1$ | $\Delta\phi_2$ | $\Delta\phi_3$ | $\Delta\phi_4$ | $V_i$ (i = 1, ..., 4) |
|---|---|---|---|---|---|---|
| 1  | 0 | 0 | 0 | 0 | 0 | 1.2 |
| 2  | 0 | $\pm\pi$ | $\pm\pi$ | $\pm\pi$ | $\pm\pi$ | 0.8 |
| 3  | 0 | 0 | $\pm\pi$ | 0 | $\pm\pi$ | 1.1776, 1.0455, .70226, 1.0455 |
| 4  | 0 | $\pm\pi$ | 0 | $\pm\pi$ | 0 | 1.0 |
| 5  | 0 | $\pm\pi$ | $\pm\pi$ | 0 | 0 | 1.0455, .70226, 1.0455, 1.1776 |
| 6  | 0 | $\pm\pi$ | 0 | 0 | $\pm\pi$ | .70226, 1.0455, 1.1776, 1.0455 |
| 7  | 0 | 0 | $\pm\pi$ | 0 | $\pm\pi$ | 1.0 |
| 8  | 0 | 0 | 0 | $\pm\pi$ | $\pm\pi$ | 1.0455, 1.1776, 1.0455, .70226 |
| 9  | $\pi$ | $\pm\pi$ | $\pm\pi$ | $\pm\pi$ | $\pm\pi$ | 1.2 |
| 10 | $\pi$ | 0 | 0 | 0 | 0 | 0.8 |
| 11 | $\pi$ | $\pm\pi$ | 0 | 0 | $\pm\pi$ | 1.1776, 1.0455, .70226, 1.0455 |
| 12 | $\pi$ | 0 | $\pm\pi$ | 0 | $\pm\pi$ | 1.0 |
| 13 | $\pi$ | 0 | 0 | $\pm\pi$ | $\pm\pi$ | 1.0455, .70226, 1.0455, 1.1776 |
| 14 | $\pi$ | 0 | $\pm\pi$ | $\pm\pi$ | 0 | .70226, 1.0455, 1.1776, 1.0455 |
| 15 | $\pi$ | $\pm\pi$ | 0 | $\pm\pi$ | 0 | 1.0 |
| 16 | $\pi$ | $\pm\pi$ | $\pm\pi$ | 0 | 0 | 1.0455, 1.1776, 1.0455, .70226 |
| 17 | $\pi/2$ | 0 | 0 | 0 | 0 | 1.0 |
| 18 | $\pi/2$ | $\pm\pi$ | $\pm\pi$ | $\pm\pi$ | $\pm\pi$ | 1.0 |
| 19 | $\pi/2$ | 0 | $\pm\pi$ | 0 | $\pm\pi$ | 1.0 |
| 20 | $\pi/2$ | $\pm\pi$ | 0 | $\pm\pi$ | 0 | 1.0 |

FIG. 3

PTM SIGNAL GENERATOR COMBINING OUTPUTS OF MULTIPLE OSCILLATORS

BACKGROUND OF THE INVENTION

The present invention relates in general to a pulse-time modulation (PTM) signal generator which combines the outputs of four or more oscillators to generate pulsed output signals.

Applicants' previously filed application, U.S. application Ser. No. 08/487,530 entitled "PTM Signal Generator Combining Outputs of Two Same Frequency Oscillators", filed Jun. 7, 1995, and now U.S. Pat. No. 5,652,548, discloses a high frequency PTM signal generator which employs first and second microwave or laser oscillators that are mutually locked either in a symmetric mode or in an antisymmetric mode by means of an electronic phase shifter. The output signals from the oscillators are combined to generate pulse-time modulated output pulses through application of a control voltage to the electronic phase shifter which switches the mutual locking of the oscillators back and forth between the symmetric and antisymmetric modes. When the oscillators are locked in the symmetric mode, an output pulse is generated, while a zero level output is generated when the oscillators are locked in the antisymmetric mode.

The invention disclosed in the '530 application is advantageous because it provides a mechanism by which pulses are generated without the need for employing speed limited oscillator switching devices which cannot be employed at very high frequencies. However, all of the embodiments disclosed in the '530 application are limited to the use of two oscillators which prevent their use in situations where higher powers are required.

SUMMARY OF THE INVENTION

The present invention is an extension of the concept disclosed in application Ser. No. 08/487,530 to embodiments for situations where higher powers are required. More particularly, extensive mathematical analysis has been conducted to verify that the inventive concept set forth in the '530 application can also be applied to more than two oscillators, and in fact can be applied to circuits employing many oscillators.

Two embodiments of the present invention employ two pairs of oscillators whose outputs are combined in a cascade manner using three combining elements, such as magic-tees. In one of these embodiments, four feedback elements, such as electronic phase shifters, are employed to control coupling of the oscillators with respect to one another. In the second embodiment, the first pair of oscillators are slaved together and the second pair of oscillators are also slaved together so that each pair effectively acts as a single oscillator means. A feedback element, such as an electronic phase shifter, is employed to control the phase between the two sets of oscillators to thereby generate the desired pulsed output.

In a third embodiment of the present invention, eight oscillators have their outputs cascaded together with magic-tees, to form a single pulsed output, and eight phase shifters are employed for coupling the oscillators to one another. This embodiment of the present invention confirms that the basic inventive concept set forth in the '530 application can be extended to larger numbers of oscillators.

BRIEF DESCRIPTION OF THE DRAWINGS

The features and advantages of the present invention will become apparent from the following detailed description of a number of preferred embodiments thereof, taken in conjunction with the accompanying drawings, in which:

FIG. 3 is a table illustrating the parameter values of the stationary points for the FIG. 2 embodiment;

DETAILED DESCRIPTION OF THE PREFERRED EMBODIMENTS

Figure 1:
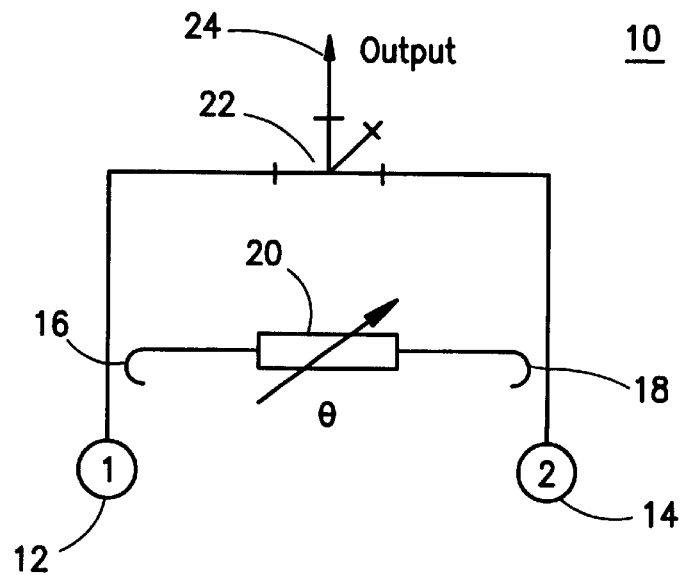
FIG. 1 is a schematic illustration of a signal generator circuit as disclosed in copending application Ser. No. 08/487,530 which employs two coupled oscillators.

Before consideration of the preferred embodiments of the present invention, reference will first be made to FIG. 1 which illustrates one of the preferred embodiments of the invention set forth in application Ser. No. 08/487,530, (now U.S. Pat. No. 5,652,548) and this application is hereby incorporated by reference. As described in greater detail in the '530 application, FIG. 1 illustrates a signal generator circuit 10 comprising first and second oscillators 12 and 14 which are continuously operated and are substantially identical to one another in operating frequency and output power. Connected between the outputs of each of the oscillators 12 and 14 through first and second directional couplers 16 and 18, respectively, is an incremental phase shifter 20.

By controlling the voltage applied to the phase shifter 20, the effective path length between the first and second oscillators 12 and 14 can be varied to be any desired multiple of $\pi$ radians long. When the path length is an even number of $\pi$ radians, the oscillators 12 and 14 will be mutually locked uniquely in their symmetric mode, and when the path length is an odd number of $\pi$ radians, the oscillators 12 and 14 will be mutually locked uniquely in their antisymmetric mode. The outputs of the oscillators 12 and 14 are coupled to a magic-tee 22 which generates a pulsed output 24 that is the sum of the outputs of the oscillators 12 and 14 when they are mutually locked in the symmetric mode, and is a zero level output when the oscillators 12 and 14 are mutually locked in the antisymmetric mode. Thus, a desired pulsed output is generated by controlling operation of the phase shifter 20 such that the oscillators 12 and 14 are switched at appropriate times between their symmetric and antisymmetric modes.

The set of differential equations corresponding to the configuration illustrated in FIG. 1 is provided below:

$$\frac{1}{V_1} \frac{dV_1}{d\tau} = \qquad (1)$$

$$-[K_{pp} \sin\gamma + H \cos\beta(V_1 - V_{1c})] + \cos(\gamma + \theta + \Delta\phi_1)V_2/V_1,$$

$$\frac{1}{V_2} \frac{dV_2}{d\tau} = \qquad (2)$$

$$-[K_{pp} \sin\gamma + H \cos\beta(V_2 - V_{1c})] + \cos(\gamma + \theta - \Delta\phi_1)V_1/V_2,$$

-continued $$\frac{d\phi_1}{d\tau} = -[K_{pp}\cos\gamma + H\sin\beta(V_1 - V_{1c})] - \sin(\gamma + \theta + \Delta\phi_1)V_2/V_1, \quad (3)$$

$$\frac{d\phi_2}{d\tau} = -[K_{pp}\cos\gamma + H\sin\beta(V_2 - V_{1c})] - \sin(\gamma + \theta - \Delta\phi_1)V_1/V_2, \quad (4)$$

where the variables of the normalized equations are: $V_i$ and $\phi_i$ are the voltage amplitude and phase of the ith oscillator; $V_c$ is the free-running amplitude; $\Delta\omega = \omega_o - \omega_c$ is the change from the free running value; C' is the equivalent capacitance of the oscillator circuit; $C_{eq}$ is C' plus the electronic capacitance-component of the active element; $\gamma$ will be nonzero if the negative conductance varies with frequency; the parameter $\beta$ includes the effects of an amplitude dependent electronic susceptance and the phase-change due to frequency dependence of the negative conductance (i.e., that of $\gamma$); $\theta$ is the phase delay of the injected locking signal introduced by the coupling circuit; $\Delta\phi_1 = \phi_1 - \phi_2$ is the relative phase of the two oscillators; the time variable is normalized by $\tau = R\ t/C_{eq}$, where R represents a loss in the coupling circuit; $K_{pp} = \Delta\omega C'/R$; and $H = \Omega_D C_{eq}/R$ where $\Omega_D$ is proportional to the amplitude dependence of the frequency The set of Equations (1–4) describes the behavior of the configuration of FIG. 1a. For $\theta = O$, $\Delta\phi_1 = O$ there is a single, stable, stationary point with the oscillators in phase and for $\theta = \pi, \Delta\phi_1 = \pm\pi$ there is also a single, stable, stationary point with the oscillators in opposite phases. These properties, along with equal voltage amplitudes of the oscillators are necessary for the operation of the proposed pulse-time modulator. To incorporate more oscillators into the modulator requires that we retain these basic properties. Although it is not readily apparent that these basic properties can be obtained using more than two oscillators, Applicants have now conducted extensive mathematical analysis to verify the configurations employing four or more oscillators are feasible.

Figure 2:
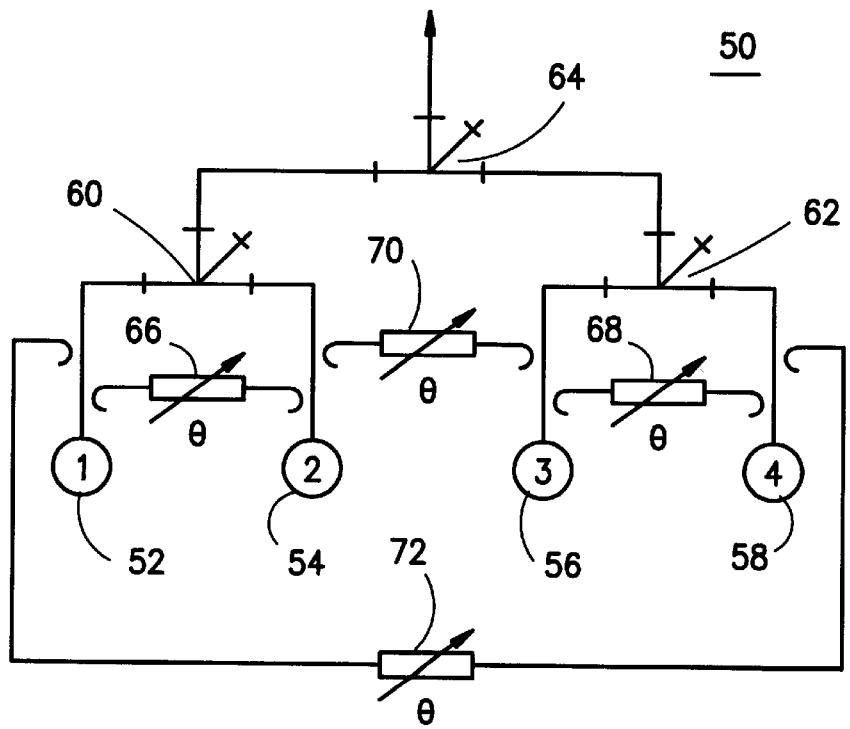
FIG. 2 is a schematic illustration of a signal generator circuit constructed in accordance with a first preferred embodiment of the present invention which employs four coupled oscillators.

A first configuration which will combine the outputs of four oscillators and retain the requisite characteristics is shown in FIG. 2. More particularly, a pulse generator circuit 50 is shown in which first, second, third and fourth substantially same frequency and power oscillators 52–58 have their outputs combined in a cascaded manner through use of first, second and third combining devices or magic-tees, 60, 62 and 64. First, second, third and fourth feedback elements or electronic phase shifters 66, 68, 70 and 72 control the coupling of each of the oscillators relative to one another through associated directional couplers 74–88. In particular, the feedback element 66 controls coupling between the first and second oscillators 52 and 54; the feedback element 68 controls coupling between the third and fourth oscillators 56 and 58; the feedback element 70 controls coupling between the second and third oscillators 54 and 56; and the fourth feedback element 72 controls coupling between the first and fourth oscillators 52 and 58. Note that a simple linear array does not meet the requirements because the voltage will not be evenly distributed over the oscillators. It is essential that the feedback environment be the same for each oscillator and this is accomplished by the feedback element 72 connecting the first oscillator 52 to the fourth oscillator 58.

The proof that the configuration in FIG. 2 has unique symmetric and antisymmetric states must be obtained from the set of equations corresponding to its circuit:

$$\frac{1}{V_1}\frac{dV_1}{d\tau} = -[K_{pp}\sin\gamma + H\cos\beta(V_1 - V_{1c})] + \quad (5)$$

$$\cos(\gamma + \theta - \Delta\phi_4)\frac{V_4}{V_1} + \cos(\gamma + \theta + \Delta\phi_1)\frac{V_2}{V_1},$$

$$\frac{1}{V_2}\frac{dV_2}{d\tau} = -[K_{pp}\sin\gamma + H\cos\beta(V_2 - V_{1c})] + \quad (6)$$

$$\cos(\gamma + \theta - \Delta\phi_1)\frac{V_1}{V_2} + \cos(\gamma + \theta + \Delta\phi_2)\frac{V_3}{V_2},$$

$$\frac{1}{V_3}\frac{dV_3}{d\tau} = -[K_{pp}\sin\gamma + H\cos\beta(V_3 - V_{1c})] + \quad (7)$$

$$\cos(\gamma + \theta - \Delta\phi_2)\frac{V_2}{V_3} + \cos(\gamma + \theta + \Delta\phi_3)\frac{V_4}{V_3},$$

$$\frac{1}{V_4}\frac{dV_4}{d\tau} = -[K_{pp}\sin\gamma + H\cos\beta(V_4 - V_{1c})] + \quad (8)$$

$$\cos(\gamma + \theta - \Delta\phi_3)\frac{V_3}{V_4} + \cos(\gamma + \theta + \Delta\phi_4)\frac{V_1}{V_4},$$

$$\frac{d\phi_1}{d\tau} = -[K_{pp}\cos\gamma + H\sin\beta(V_1 - V_{1c})] - \quad (9)$$

$$\sin(\gamma + \theta - \Delta\phi_4)\frac{V_4}{V_1} - \sin(\gamma + \theta + \Delta\phi_1)\frac{V_2}{V_1},$$

$$\frac{d\phi_2}{d\tau} = -[K_{pp}\cos\gamma + H\sin\beta(V_2 - V_{1c})] - \quad (10)$$

$$\sin(\gamma + \theta - \Delta\phi_1)\frac{V_1}{V_2} - \sin(\gamma + \theta + \Delta\phi_2)\frac{V_3}{V_2},$$

$$\frac{d\phi_3}{d\tau} = -[K_{pp}\cos\gamma + H\sin\beta(V_3 - V_{1c})] - \quad (11)$$

$$\sin(\gamma + \theta - \Delta\phi_2)\frac{V_2}{V_3} - \sin(\gamma + \theta + \Delta\phi_3)\frac{V_4}{V_3},$$

$$\frac{d\phi_4}{d\tau} = -[K_{pp}\cos\gamma + H\sin\beta(V_4 - V_{1c})] - \quad (12)$$

$$\sin(\gamma + \theta - \Delta\phi_3)\frac{V_3}{V_4} - \sin(\gamma + \theta + \Delta\phi_4)\frac{V_1}{V_4},$$

where we have defined the relative phase as $\Delta\phi_i = \phi_i - \phi_{i+1}$ with $i = 1, \ldots, 4$.

Equations (9–12) determine the stationary points by setting the time derivatives to zero. Before delineating the stationary points let us simplify the discussion by assuming an ideal oscillator (i.e. one with an amplitude dependent negative conductance which is not dependent on frequency and has no electronic susceptance). These assumptions allow us to set $\gamma = \beta = O$. Further we subtract pairs of equations to obtain the time derivatives of the relative phases:

$$\frac{1}{V_1}\frac{dV_1}{d\tau} = \quad (13)$$

$$-H(V_1 - V_{1c}) + \cos(\theta - \Delta\phi_4)\frac{V_4}{V_1} + \cos(\theta + \Delta\phi_1)\frac{V_2}{V_1},$$

$$\frac{1}{V_2}\frac{dV_2}{d\tau} = \quad (14)$$

$$-H(V_2 - V_{1c}) + \cos(\theta - \Delta\phi_1)\frac{V_1}{V_2} + \cos(\theta + \Delta\phi_2)\frac{V_3}{V_2},$$

$$\frac{1}{V_3}\frac{dV_3}{d\tau} = \quad (15)$$

$$-H(V_3 - V_{1c}) + \cos(\theta - \Delta\phi_2)\frac{V_2}{V_3} + \cos(\theta + \Delta\phi_3)\frac{V_4}{V_3},$$

$$\frac{1}{V_4}\frac{dV_4}{d\tau} = \quad (16)$$

$$-H(V_4 - V_{1c}) + \cos(\theta - \Delta\phi_3)\frac{V_3}{V_4} + \cos(\theta + \Delta\phi_4)\frac{V_1}{V_4},$$

-continued $$\frac{d\Delta\phi_1}{d\tau} = -\sin(\theta - \Delta\phi_4)\frac{V_4}{V_1} - \quad (17)$$

$$\sin(\theta + \Delta\phi_1)\frac{V_2}{V_1} + \sin(\theta - \Delta\phi_1)\frac{V_1}{V_2} + \sin(\theta + \Delta\phi_2)\frac{V_3}{V_2},$$

$$\frac{d\Delta\phi_2}{d\tau} = -\sin(\theta - \Delta\phi_1)\frac{V_1}{V_2} - \quad (18)$$

$$\sin(\theta + \Delta\phi_2)\frac{V_3}{V_2} + \sin(\theta - \Delta\phi_2)\frac{V_2}{V_3} + \sin(\theta + \Delta\phi_3)\frac{V_4}{V_3},$$

$$\frac{d\Delta\phi_3}{d\tau} = -\sin(\theta - \Delta\phi_2)\frac{V_2}{V_3} - \quad (19)$$

$$\sin(\theta + \Delta\phi_3)\frac{V_4}{V_3} + \sin(\theta - \Delta\phi_3)\frac{V_3}{V_4} + \sin(\theta + \Delta\phi_4)\frac{V_1}{V_4},$$

$$\frac{d\Delta\phi_4}{d\tau} = -\sin(\theta - \Delta\phi_3)\frac{V_3}{V_4} - \quad (20)$$

$$\sin(\theta + \Delta\phi_4)\frac{V_1}{V_4} + \sin(\theta - \Delta\phi_4)\frac{V_4}{V_1} + \sin(\theta + \Delta\phi_1)\frac{V_2}{V_1}.$$

This nonlinear set of equations (13–20) is used to delineate the stationary points of the set of four coupled oscillators. Note that there is one more condition on the relative phases, $$\Delta\phi_1+\Delta\phi_2+\Delta\phi_3+\Delta\phi_4=O, \ 2\pi n, \quad (21)$$

thus reducing the rank of the matrix to seven.

The table in FIG. 3 shows the parameter values for a nominal choice of feedback (H=10 and $V_c$=1.0), and is complete for values of the feedback phase of zero or $\pi$ radians (i.e., for points 1–16). The remaining four points (17–20) are a partial list of stationary points used to show undesirable, but avoidable, properties that are to be excluded from the operation of the present invention. From this list of stationary points we wish to identify the stable ones which constitute a much smaller subset. This identification is accomplished by making a linear expansion about each stationary point and calculating the trajectories in phase space resulting from a small perurbation. The general matrix elements that are obtained from this perturbation procedure are listed below and the matrix is denoted by the symbol A.

For each of the points listed in the table of FIG. 3 the eigenvalues of A are determined and those with values greater than zero are unstable while those with values equal or less than zero are stable points. This stability criterion eliminates as unstable all the points except $P_1$, $P_9$, and $P_{17}$, $P_{18}$, $P_{19}$, $P_{20}$. $P_1$ corresponds to the symmetric point where all the oscillators are in phase and $P_9$ corresponds to the antisymmetric case where the oscillators alternate in phase.

This last set of points (17–20) illustrates why control of the feedback phase is necessary. It might be thought that strong coupling would insure cooperative behavior and that the most efficient coupling would be reactive (i.e., $\theta=\pi/2$), but, as the calculations show, the symmetric and several antisymmetric states are simultaneously stable. Thus control of the symmetric and antisymmetric states can be obtained only by individual oscillator adjustment.

Figure 4:
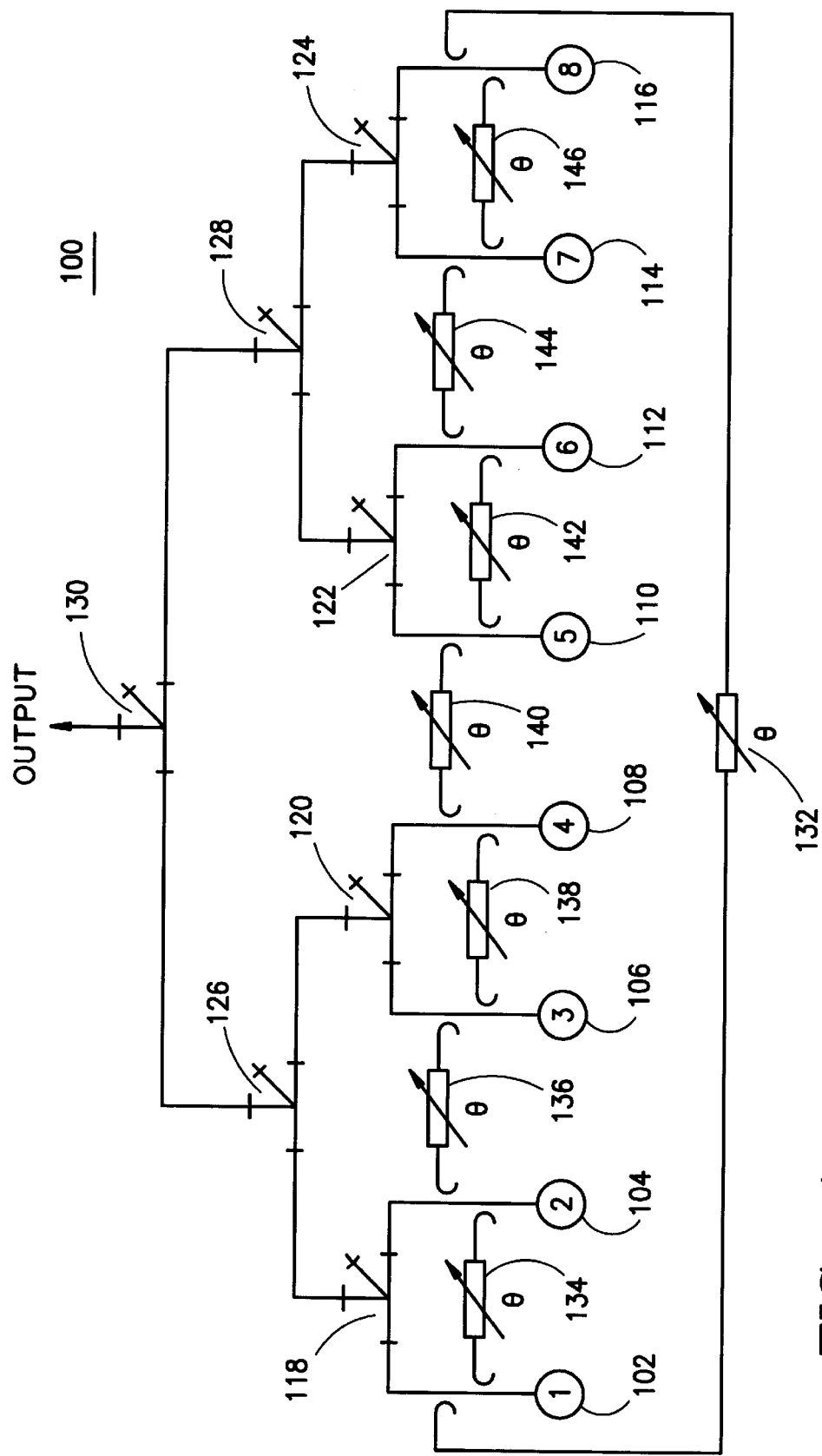
FIG. 4 is a schematic illustration of a pulse generator circuit constructed in accordance with a second preferred embodiment of the present invention which employs eight coupled oscillators.

The elements of the stability matrix for four oscillators coupled in the manner shown in FIG. 2 are presented below. The variables $\delta V_{io}$ and $V_{io}\,\delta\Delta\phi_{io}$ represent variations ($\delta$) about a stationary point denoted by the subscript "o" and the phases are rationalized so that the matrix elements are dimensionless:

$A_{11}=-H(2V_{1o}-V_{1c})$
$A_{21}=\cos(\theta-\Delta\phi_o)$
$A_{31}=0$
$A_{41}=\cos(\theta+\Delta\phi_{4o})$
$A_{51}=\sin(\theta+\Delta\phi_{1o})V_{2o}/V_{1o}+\sin(\theta-\Delta\phi_{1o})V_{1o}/V_{2o}+\sin(\theta-\Delta\phi_{4o})V_{4o}/V_{1o}$
$A_{61}=-\sin(\theta-\Delta\phi_{1o})$
$A_{71}=\sin(\theta+\Delta\phi_{4o})V_{3o}/V_{4o}$
$A_{81}=-\sin(\theta+\Delta\phi_{4o})-\sin(\theta-\Delta\phi_{4o})(V_{4o}/V_{1o})^2-\sin(\theta+\Delta\phi_{1o})V_{2o}V_{4o}/V_{1o}^2$
$A_{12}=\cos(\theta+\Delta\phi_{1o})$
$A_{22}=-H(2V_{2o}-/V_{1c})$
$A_{32}=\cos(\theta-\Delta\phi_{2o})$
$A_{42}=0$
$A_{52}=-\sin(\theta+\Delta\phi_{1o})-\sin(\theta-\Delta\phi_{1o})(V_{1o}/V_{2o})^2-\sin(\theta+\Delta\phi_{2o})V_{1o}V_{3o}/V_{2o}^2$
$A_{62}=\sin(\theta-\Delta\phi_{1o})V_{1o}/V_{2o}+\sin(\theta-\Delta\phi_{2o})V_{2o}/V_{3o}+\sin(\theta+\Delta\phi_{2o})V_{3o}/V_{2o}$
$A_{72}=-\sin(\theta-\Delta\phi_{2o})$
$A_{82}=\sin(\theta+\Delta\phi_{1o})V_{4o}/V_{1o}$
$A_{13}=0$
$A_{23}=\cos(\theta+\Delta\phi_{2o})$
$A_{33}=-H(2V_{3o}-V_{1c})$
$A_{43}=\cos(\theta-\Delta\phi_{3o})$
$A_{53}=\sin(\theta+\Delta\phi_{2o})V_{1o}/V_{2o}$
$A_{63}=-\sin(\theta-\Delta\phi_{2o})(V_{2o}/V_{3o})^2-\sin(\theta+\Delta\phi_{2o})-\sin(\theta+\Delta\phi_{3o})V_{2o}V_{4o}/V_{3o}^2$
$A_{73}=\sin(\theta-\Delta\phi_{2o})V_{2o}/V_{3o}+\sin(\theta-\Delta\phi_{3o})V_{3o}/V_{4o}+\sin(\theta+\Delta\phi_{3o})V_{4o}/V_{3o}$
$A_{83}=-\sin(\theta-\Delta\phi_{3o})$
$A_{14}=\cos(\theta-\Delta\phi_{4o})$
$A_{24}=0$
$A_{34}=\cos(\theta+\Delta\phi_{3o})$
$A_{44}=-H(2V_{4o}-V_{1c})$
$A_{54}=-\sin(\Gamma-\Delta\phi_{4o})$
$A_{64}=\sin(\theta+\Delta\phi_{3o})V_{2o}/V_{3o}$
$A_{74}=-\sin(\theta-\Delta\phi_{3o})(V_{3o}/V_{4o})^2-\sin(\theta+\Delta\phi_{3o})-\sin(\theta+\Delta\phi_{4o})V_{1o}V_{3o}/V_{4o}^2$
$A_{84}=\sin(\theta-\Delta\phi_{3o})V_{3o}/V_{4o}+\sin(\theta+\Delta\phi_{4o})V_{1o}/V_{4o}+\sin(\theta-\Delta\phi_{4o})V_{4o}/V_{1o}$
$A_{15}=-\sin(\theta+\Delta\phi_{1o})V_{2o}/V_{1o}$
$A_{25}=\sin(\theta-\Delta\phi_{1o})$
$A_{35}=0$
$A_{45}=0$
$A_{55}=-\cos(\theta+\Delta\phi_{1o})V_{2o}/V_{1o}-\cos(\theta-\Delta\phi_{1o})V_{1o}/V_{2o}$
$A_{65}=\cos(\theta-\Delta\phi_{1o})$
$A_{75}=0$
$A_{85}=\cos(\theta+\Delta\phi_{1o})(V_{2o}/V_{1o})^2$
$A_{16}=0$
$A_{26}=-\sin(\theta+\Delta\phi_{2o})V_{3o}/V_{2o}$
$A_{36}=\sin(\theta-\Delta\phi_{2o})$
$A_{46}=0$
$A_{56}=\cos(\theta+\Delta\phi_{2o})V_{1o}\,V_{3o}/V_{2o}^2$
$A_{66}=-\cos(\theta-\Delta\phi_{2o})V_{2o}/V_{3o}-\cos(\theta+\Delta\phi_{2o})V_{3o}/V_{2o}$
$A_{76}=\cos(\theta-\Delta\phi_{2o})$
$A_{86}=0$
$A_{17}=0$
$A_{27}=0$
$A_{37}=-\sin(\theta+\Delta\phi_{3o})V_{4o}/V_{3o}$
$A_{47}=\sin(\theta-\Delta\phi_{3o})$ $A_{57}=0$ $A_{67}=\cos(\theta+\Delta\phi_{3o})V_{2o}V_{4o}/V_{3o}^2$ $A_{77}=-\cos(\theta-\Delta\phi_{3o})V_{3o}/V_{4o}-\cos(\theta+\Delta\phi_{3o})V_{4o}/V_{3o}$ $A_{87}=\cos(\theta-\Delta\phi_{3o})$ $A_{18}=\sin(\theta-\Delta\phi_{4o})$ $A_{28}=0$ $A_{38}=0$ $A_{48}=-\sin(\theta+\Delta\phi_{4o})V_{1o}/V_{4o}$ $A_{58}=\cos(\theta-\Delta\phi_{4o})$ $A_{68}=0$ $A_{78}=\cos(\theta+\Delta\phi_{4o})V_{1o}V_{3o}/V_{4o}^2$ $A_{88}=-\cos(\theta-\Delta\phi_{4o})V_{4o}/V_{1o}-\cos(\theta+\Delta\phi_{4o})V_{1o}/V_{4o}$ By combining multiple oscillators in the cascaded manner illustrated in FIG. 2, any number of oscillators can have their outputs combined to form a single pulsed output. For example, FIG. 4 illustrates a pulse generator circuit 100 in which the outputs from eight oscillators 102–116 have their outputs combined through the use of seven magic-tees or other combining elements 118–130, and eight electronic phase shifters or other feedback elements 132–146 are employed for controlling the coupling between the oscillators to achieve the necessary phase relationships. The number of stationary points increases to 256 for $\theta=0$ or $\pi$. It can be shown by extrapolating the stability matrix to eight oscillators, and by symmetry arguments, that only the symmetric and antisymmetric states corresponding to $P_1$ and $P_9$ of the FIG. 3 table are stable and nondegenerate. Note that the discussion has concerned groups of $2^n$ oscillators in order to preserve the method of combining the outputs into a single one. For other methods of combining outputs, it is possible to use just an even number of oscillators while still retaining the control of the symmetric and antisymmetric phase relationships of the oscillators.

Figure 5:
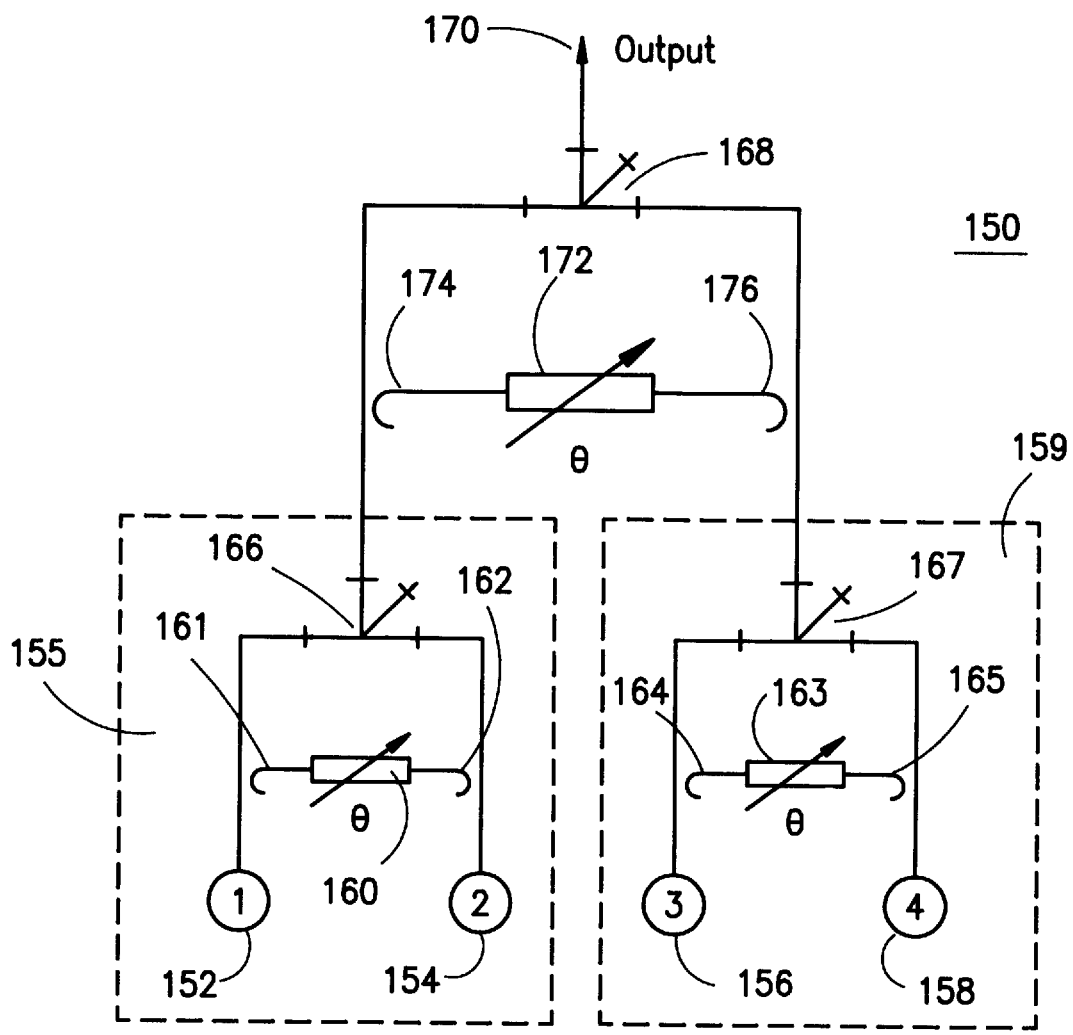
FIG. 5 is a schematic illustration of another embodiment of the present invention which employs four coupled oscillators.

Another embodiment of the present invention which employs two pairs of oscillators is illustrated in FIG. 5. More particularly, a pulse generator circuit 150 is shown in which first and second oscillators 152 and 154 are slaved together to form a first oscillator means 155 and third and fourth oscillators 156 and 158 are slaved together to form a second oscillator means 159. A first feedback element or electronic phase shifter 160 and associated directional couplers 161 and 162 are employed for coupling the first and second oscillators 152 and 154 in a symmetric mode, while a second feedback element or electronic phase shifter 163 and associated directional couplers 164 and 165 are employed for coupling the third and fourth oscillators 156 and 158 in a symmetric mode.

A first magic-tee 166 combines the outputs from the first and second oscillators 152 and 154 to generate the oscillating output of the first oscillator means 155. Similarly, a second magic-tee 167 combines the outputs of the third and fourth oscillators 156 and 158 to form the oscillating output of the second oscillator means 159. These two outputs are then combined by a third magic-tee 168 which generates a pulsed output 170 that is controlled by a third feedback element or electronic phase shifter 172 which controllably couples the outputs of the two oscillator means outputs 155 and 159 through two directional couplers 174 and 176.

The foregoing embodiment of the present invention results in the same effective operation as that of the first embodiment illustrated in FIG. 2, however, uses only three coupling circuits (e.g., phase shifters) instead of four. It should be understood that the type of coupling arrangement employed in FIG. 5 could also be employed in the FIG. 3 embodiment as well as in other embodiments employing more than eight oscillators. Note that this reconfiguration will change the mode structure, but it preserves the properties of $P_1$ and $P_9$ of FIG. 2 (i.e., the nondegeneracy and stability of the completely symmetric and antisymmetric modes).

In summary, the foregoing analysis establishes that the fundamental concepts employed in the invention set forth in the '530 application can be extended to pulse generator circuits employing four or more oscillators. These multiple oscillator circuits provide a particularly attractive solution to the problem presented by high power requirements because circuits which combine oscillators are more efficient in operation than circuits which combine amplifiers. The efficiency of the combining can be further increased by recovering power that is dissipated by the various directional couplers in the circuits since the power's phase is locked to the rest of the array. As a final note, it should be noted that the foregoing oscillator combining techniques, like the two oscillator technique disclosed in the '530 application, can, in principle, be used with any high frequency applications, up to and including those employing optical frequencies.

Although the invention has been disclosed in terms of a number of preferred embodiments and variations thereon, it will be understood that numerous additional modifications and variations could be made thereto without departing from the scope of the invention as defined in the following claims.

What is claimed is:

1. A pulse signal generator comprising:
    a plurality of four or more oscillators, each generating an output signal;
    means for combining the output signals from said plurality of oscillators and forming a pulsed output signal; and
    means for mutually locking said plurality of oscillators uniquely to one another in either a first, symmetric mode, or in a second, antisymmetric mode to thereby control said pulsed output signal.

2. The signal generator of claim 1, wherein said means for combining further comprises:
    first means for combining the outputs from a first pair of said plurality of oscillators and generating a first combined output signal;
    second means for combining the output signals from a second pair of said plurality of oscillators and generating a second combined output signal; and
    means for combining said first combined output signal and said second combined output signal to form said pulsed output signal.

3. The signal generator of claim 2, wherein said means for mutually locking further comprises:
    a first feedback element for coupling said first pair of oscillators;
    a second feedback element for coupling said second pair of oscillators; and
    a third feedback element for coupling said first and second combined output signals either in a first, symmetric mode, or in a second, antisymmetric mode.

4. The signal generator of claim 2, wherein said means for mutually locking further comprises:
    a first feedback element for coupling said first pair of oscillators;
    a second feedback element for coupling said second pair of oscillators;
    a third feedback element for coupling a second oscillator in said first pair of oscillators with a first oscillator said second pair of oscillators; and a fourth feedback element for coupling a first oscillator in said first pair of oscillators with a second oscillator in said second pair of oscillators.

5. The pulse signal generator of claim 1, wherein said plurality of four or more oscillators includes at least eight oscillators.

6. The signal generator of claim 5, wherein said means for combining further comprises:

first means for combining the outputs from a first pair of said eight oscillators and generating a first combined output signal;

second means for combining the output signals from a second pair of said eight oscillators and generating a second combined output signal;

third means for combining the output signals from a third pair of said eight oscillators and generating a third combined output signal;

fourth means for combining the output signals from a fourth pair of said eight oscillators and generating a fourth combined output signal;

fifth means for combining said first and second combined output signals and generating a fifth combined output signal;

sixth means for combining said third and fourth combined output signals and generating a sixth combined output signal; and seventh means for combining said fifth and sixth combined output signals and generating said pulsed output signal.

7. The signal generator of claim 6, wherein said means for mutually locking further comprises:

a first feedback element for coupling first and second of said eight oscillators;

a second feedback element for coupling a third and a fourth of said oscillators;

a third feedback element for coupling a fifth and a sixth of said eight oscillators;

a fourth feedback element for coupling a seventh and an eighth of said eight oscillators;

a fifth feedback element for coupling said first and said eighth oscillators;

a sixth feedback element for coupling said second and third oscillators;

a seventh feedback element for coupling said fourth and fifth oscillators; and an eighth feedback element for coupling said sixth and seventh oscillators.

8. The signal generator of claim 7, wherein each of said feedback elements comprises an electronic phase shifter.

9. The signal generator of claim 6, wherein each of said means for combining comprises a magic-tee.

10. The signal generator of claim 2, wherein each of said means for combining comprises a magic-tee.

11. The signal generator of claim 3, wherein each of said feedback elements comprises an electronic phase shifter.

12. The signal generator of claim 4, wherein each of said feedback elements comprises an electronic phase shifter.

13. A method for generating a pulsed output signal comprising the steps of:

(a) providing a plurality of oscillators, each of said oscillators generating an output signal, each of said output signals having substantially the same frequency;

(b) combining the output signals from said plurality of oscillators to form said pulsed output signal; and (c) mutually locking said plurality of oscillators uniquely to one another in either a first, symmetric mode, or in a second, antisymmetric mode to thereby control said pulsed output signal.

14. The method of claim 13, wherein said step of providing a plurality of oscillators further comprises providing a plurality of four or more oscillators.

15. The method of claim 14, wherein said step of combining further comprises:

combining the outputs from a first pair of said plurality of oscillators and generating a first combined output signal;

combining the outputs from a second pair of said plurality of oscillators and generating a second combined output signal; and combining said first combined output signal and said second combined output signal to form said pulsed output signal.

16. The method of claim 15, wherein each of said combining steps is carried out using a magic-tee.

17. The method of claim 13, wherein said step of providing a plurality of oscillators further comprises providing at least one pair of oscillators, and said step of mutually locking said plurality of oscillators further comprises coupling each pair of said plurality of oscillators with a corresponding feedback element.

18. The method of claim 17, wherein said feedback element is selected to be an electronic phase shifter.

19. The method of claim 17, where at least first and second pairs of oscillators are provided, and said step of mutually locking further comprises:

coupling said first pair of oscillators with a first feedback element;

coupling said second pair of oscillators with a second feedback element; and coupling a first combined output signal from said first pair of oscillators and a second combined output signal from a second pair of said oscillators with a third feedback element.

20. The method of claim 19, wherein each of said feedback elements is selected to be an electronic phase shifter.

* * * * *